(12) United States Patent
Lyons et al.

(10) Patent No.: US 8,450,445 B2
(45) Date of Patent: *May 28, 2013

(54) LIGHT EMITTING DIODE MANUFACTURING METHOD

(75) Inventors: John W. Lyons, Midland, MI (US); Binghe Gu, Midland, MI (US); Allen S. Bulick, Lansdale, PA (US); Weijun Zhou, Sugar Land, TX (US); Paul J. Popa, Auburn, MI (US); Garo Khanarian, Princeton, NJ (US); John R. Ell, Quakertown, PA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 78 days.

This patent is subject to a terminal disclaimer.

(21) Appl. No.: 13/211,378

(22) Filed: Aug. 17, 2011

(65) Prior Publication Data

US 2013/0045552 A1    Feb. 21, 2013

(51) Int. Cl.
*C08G 77/00*    (2006.01)

(52) U.S. Cl.
USPC .......................................................... 528/43

(58) Field of Classification Search
USPC .......................................................... 528/43
See application file for complete search history.

(56) References Cited

U.S. PATENT DOCUMENTS

| | | | |
|---|---|---|---|
| 3,801,535 | A | 4/1974 | Joschko |
| 4,318,939 | A | 3/1982 | Wong |
| 6,274,924 | B1 | 8/2001 | Carey et al. |
| 7,470,974 | B2 | 12/2008 | Bhandarkar et al. |
| 7,521,727 | B2 | 4/2009 | Khanarian et al. |
| 7,595,113 | B2 | 9/2009 | Miyoshi |
| 2005/0006651 | A1 | 1/2005 | LeBoeuf et al. |
| 2006/0105484 | A1 | 5/2006 | Basin et al. |
| 2007/0148476 | A1 | 6/2007 | Khanarian et al. |
| 2008/0160323 | A1 | 7/2008 | Mosley et al. |
| 2009/0039313 | A1 | 2/2009 | Conner et al. |
| 2009/0146324 | A1 | 6/2009 | Auld et al. |
| 2009/0163654 | A1 | 6/2009 | Hirano |
| 2010/0025724 | A1 | 2/2010 | Bae et al. |
| 2010/0155871 | A1 | 6/2010 | Hirano |
| 2010/0221666 | A1 | 9/2010 | Popa et al. |
| 2010/0291374 | A1 | 11/2010 | Akarsu et al. |

FOREIGN PATENT DOCUMENTS

| | | |
|---|---|---|
| WO | 2003011944 | 2/2003 |
| WO | 2007053396 | 5/2007 |

OTHER PUBLICATIONS

Chen, et al., Synthesis and characterization of oligomeric phenylsilsesquioxane-titania hybrid optical thin films, Materials Chemistry and Physics 83, 71-77 (2004).

Kim, et al., Thermally stable transparent sol-gel based siloxane hybrid material with high refractive index for light emitting diode (LED) encapsulation, Chemistry of materials 22, 3549-55 (May 13, 2010).

Ravirajan, et al. The effect of polymer optoelectronic properties on the performance of multilayer hybrid polymer/TiO2 solar cells, Advanced functional materials, v. 15, No. 4, pp. 609-618 (2005).

Copending U.S. Appl. No. 13/109,053.
Copending U.S. Appl. No. 13/211,363.
Copending U.S. Appl. No. 13/109,045.

*Primary Examiner* — Kuo-Liang Peng
(74) *Attorney, Agent, or Firm* — Thomas S. Deibert

(57) ABSTRACT

A method of making a light emitting diode (LED) having an optical element is provided, comprising: providing a curable liquid polysiloxane/$TiO_2$ composite, which exhibits a refractive index of >1.61 to 1.7 and which is a liquid at room temperature and atmospheric pressure; providing a semiconductor light emitting diode die having a face, wherein the semiconductor light emitting diode die emits light through the face; contacting the semiconductor light emitting diode die with the curable liquid polysiloxane/$TiO_2$ composite; and, curing the curable liquid polysiloxane/$TiO_2$ composite to form an optical element; wherein at least a portion of the optical element is adjacent to the face.

10 Claims, No Drawings

LIGHT EMITTING DIODE MANUFACTURING METHOD

The present invention relates to a method of making a light emitting diode (LED) having an optical element comprising: providing a curable liquid polysiloxane/TiO$_2$ composite, which exhibits a refractive index of >1.61 to 1.7 and which is a liquid at room temperature and atmospheric pressure; providing a semiconductor light emitting diode die having a face, wherein the semiconductor light emitting diode die emits light through the face; contacting the semiconductor light emitting diode die with the curable liquid polysiloxane/TiO$_2$ composite; and, curing the curable liquid polysiloxane/TiO$_2$ composite to form an optical element; wherein at least a portion of the optical element is adjacent to the face.

Light emitting diode (LED) devices typically comprise an LED die that is encapsulated by an optically clear and thermally stable material. The encapsulating material generally serves at least one of three functions, namely (1) it facilitates incorporation of the light emitting diode into a device; (2) it provides protection for the fragile wiring for the light emitting diode; and (3) it behaves as a refractive intermediary between the high index die and low index air. In some LED devices, a preformed plastic lens or glass lens is affixed or bonded to a package in which the LED die is mounted. A curable liquid encapsulant material is then injected into the cavity between the LED die and the plastic lens (or glass lens) and is subsequently cured to completely seal the LED die.

Accordingly, high refractive index polymers are of interest as lens and encapsulant materials for use in light emitting diode device applications. For example, in the manufacture of LED devices, manufacturers desire optical polymers with high transparency in the visible region, high refractive indices (i.e., refractive indices of approximately 1.60 or higher), and excellent heat stability over tens of thousands of hours of operation. The use of high refractive index materials can considerably improve the light extraction efficiency from a LED die at the same drive current, hence making the LED device more energy efficient. Additionally the LED device industry uses liquid prepolymers, which are then cured in place after much of the device has already been assembled. Therefore the curing polymer system must show minimal shrinkage, and must be curable under conditions which do not harm the assembled device.

Materials conventionally used to encapsulate LED dies include epoxy resins and silicones. Conventional epoxy resins tend to exhibit poor light stability (i.e., they tend to yellow over time) following prolonged exposure to ultraviolet light or to elevated thermal conditions. This yellowing leads to a reduction in light output from a led device over time. On the other hand, conventional silicones exhibit much better heat and light stability. As a result, silicones are becoming the dominant encapsulant for use in LED devices. Conventional silicone encapsulants; however, exhibit refractive indices ranging from 1.41 to 1.57 (measured at 550 nm). Moreover, it has proven difficult to achieve refractive indices of higher than about 1.6 (measured at 550 nm) without compromising other key performance properties such as flowability in the uncured state.

One group of liquid prepolymers are disclosed by Conner et al. in United States Patent Application Publication No. 2009/0039313. Conner et al. disclose a (thio)phenoxyphenyl phenyl silane composition comprising a (thio)phenoxyphenyl phenyl silane having formula I

(I)

wherein: Ph$^1$ is a phenyl ring having Ph$^2$-Q-, —Si(Ph$^3$)(OR)$_2$ and four hydrogen atoms as substituents; Ph$^2$-Q is a (thio)phenoxy group where Ph$^2$ is phenyl and Q is selected from oxygen atom, sulfur atom, and combinations thereof; Ph$^2$-Q is in a position on the Ph$^1$ phenyl ring which is ortho-, meta-, or para-relative to the Si atom; Ph$^3$ is phenyl; and R is independently selected from a hydrogen atom, a C$_{1-10}$ hydrocarbon radical, and combinations thereof; wherein the C$_{1-10}$ hydrocarbon radical is independently selected from: linear, branched, or cyclic C$_{1-10}$ alkyl; phenyl; substituted phenyl; arylalkyl; and combinations thereof.

As semiconductor light emitting diode (LED) dies find ever increasing use in a variety of applications including, for example, in solid state lighting, aviation lighting, automotive lighting (e.g., brake lamps, turn signals and indicators) and traffic lights; there is a continuing need for improved manufacturing methods, in particular, mass production methods for producing them. As a result, there is an increasing trend of directly molding curable liquid encapsulant material onto an LED die using an in-line molding process. In these in-line molding processes, a curable liquid encapsulant material is injected or potted into a mold cavity containing an LED die (or into which an LED die is immersed) and then curing the encapsulant material, wherein the encapsulant material both encapsulates the LED die and forms a lens for shaping the light emitted from the LED die. Such in-line molding processes eliminate the prefabrication and assembly of a lens into the LED device. As a result, such in-line molding processes promise more cost effective high volume manufacturing of LED devices.

An in line molding process is disclosed by Basin et al. in U.S. Pat. No. 7,344,902. Basin et al. disclose an over molding process, wherein one or more LED dies mounted on a support structure are oriented with a mold having indentations corresponding to the positions of the LED dies on the support structure; wherein the indentations in the mold are filled with a liquid, optically transparent material, which when cured forms a hardened lens material. Basin et al. further disclose that the mold and the LED dies support structure are brought together so that each LED die resides within the liquid lens material in an associated indentation.

Notwithstanding, there remains a need for improved methods of manufacturing semiconductor light emitting diode (LED) dies using liquid curable materials having a high refractive index, good thermal stability, transparency, and that are liquid in their uncured state (without the need for the addition of fugitive solvents) which facilitate the mass production of semiconductor light emitting diode (LED) dies.

The present invention provides a method of making a light emitting diode (LED) having an optical element, comprising: providing a curable liquid polysiloxane/TiO$_2$ composite, comprising: (a) providing: (i) D units having a formula R$^1$(R$^2$)Si(OR$^6$)$_2$; (ii) T units having a formula R$^3$Si(OR$^7$)$_3$; (iii) optionally, M units having a formula R$^4{}_3$SiOR$^8$; and, (iv) optionally, Q units having a formula Si(OR$^9$)$_4$; wherein each R$^1$ and R$^3$ is independently selected from a C$_{6-10}$ aryl group and a C$_{7-20}$ alkylaryl group; wherein each R$^2$ is a phenoxyphenyl group; wherein each R$^4$ is independently selected from a C$_{1-10}$ alkyl group, a C$_{7-10}$ arylalkyl group, a C$_{7-10}$ alkylaryl group and a C$_{6-10}$ aryl group; wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; and wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; wherein the D units contain >1 ppb to ≦100 ppm in combined total of all target contaminants having formulae selected from $R^1$—O—$(R^2)Si(OR^6)_2$; $R^2$—O—$(R^1)Si(OR^6)_2$; $R^1(R^{10})Si(OR^6)_2$; and, $R^2(R^{11})Si(OR^6)_2$; wherein $R^{10}$ is selected from a phenol-oxy-phenyl group and a phenyloxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/$TiO_2$ composite; wherein the curable liquid polysiloxane/$TiO_2$ composite exhibits a refractive index of >1.61 to 1.7 and wherein the curable liquid polysiloxane/$TiO_2$ composite is a liquid at room temperature and atmospheric pressure; providing a semiconductor light emitting diode die having a face, wherein the semiconductor light emitting diode die emits light through the face; contacting the semiconductor light emitting diode die with the curable liquid polysiloxane/$TiO_2$ composite; and, curing the curable liquid polysiloxane/$TiO_2$ composite to form an optical element; wherein at least a portion of the optical element is adjacent to the face.

The present invention also provides a method of making a light emitting diode (LED) having an optical element, comprising: providing a curable liquid polysiloxane/$TiO_2$ composite, comprising: (a) providing: (i) D units having a formula $R^1(R^2)Si(OR^6)_2$; (ii) T units having a formula $R^3Si(OR^7)_3$; (iii) optionally, M units having a formula $R^4_3SiOR^8$; and, (iv) optionally, Q units having a formula $Si(OR^9)_4$; wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; and wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≦100 ppm in combined total of all target contaminants having formulae selected from $R^1$—O—$(R^2)Si(OR^6)_2$; $R^2$—O—$(R^1)Si(OR^6)_2$; $R^1(R^{10})Si(OR^6)_2$; and, $R^2(R^{11})Si(OR^6)_2$; wherein $R^{10}$ is selected from a phenol-oxy-phenyl group and a phenyloxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/$TiO_2$ composite; wherein the curable liquid polysiloxane/$TiO_2$ composite exhibits a refractive index of >1.61 to 1.7 and wherein the curable liquid polysiloxane/$TiO_2$ composite is a liquid at room temperature and atmospheric pressure; providing a semiconductor light emitting diode die having a face, wherein the semiconductor light emitting diode die emits light through the face; providing a mold with a cavity; filling the cavity with the curable liquid polysiloxane/$TiO_2$ composite; contacting the semiconductor light emitting diode die with the curable liquid polysiloxane/$TiO_2$ composite in the cavity; and, curing the curable liquid polysiloxane/$TiO_2$ composite to form an optical element; wherein the optical element encapsulates the semiconductor light emitting diode die.

The present invention also provides a method of making a light emitting diode (LED) having an optical element, comprising: providing a curable liquid polysiloxane/$TiO_2$ composite, comprising: (a) providing: (i) D units having a formula $R^1(R^2)Si(OR^6)_2$; (ii) T units having a formula $R^3Si(OR^7)_3$; (iii) optionally, M units having a formula $R^4_3SiOR^8$; and, (iv) optionally, Q units having a formula $Si(OR^9)_4$; wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; and wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≦100 ppm in combined total of all target contaminants having formulae selected from $R^1$—O—$(R^2)Si(OR^6)_2$; $R^2$—O—$(R^1)Si(OR^6)_2$; $R^1(R^{10})Si(OR^6)_2$; and, $R^2(R^{11})Si(OR^6)_2$; wherein $R^{10}$ is selected from a phenol-oxy-phenyl group and a phenyloxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/$TiO_2$ composite; wherein the curable liquid polysiloxane/$TiO_2$ composite exhibits a refractive index of >1.61 to 1.7 and wherein the curable liquid polysiloxane/$TiO_2$ composite is a liquid at room temperature and atmospheric pressure; providing a semiconductor light emitting diode die having a face, wherein the semiconductor light emitting diode die emits light through the face; providing a mold with a cavity; filling the cavity with the curable liquid polysiloxane/$TiO_2$ composite; contacting the semiconductor light emitting diode die with the curable liquid polysiloxane/$TiO_2$ composite in the cavity, wherein the semiconductor light emitting diode die is immersed in the curable liquid polysiloxane/$TiO_2$ composite; and, curing the curable liquid polysiloxane/$TiO_2$ composite to form an optical element wherein the optical element encapsulates the semiconductor light emitting diode die.

The present invention provides a method of making a light emitting diode (LED) having an optical element, comprising: providing a curable liquid polysiloxane/$TiO_2$ composite, comprising: (a) providing: (i) D units having a formula $R^1(R^2)Si(OR^6)_2$; (ii) T units having a formula $R^3Si(OR^7)_3$; (iii) optionally, M units having a formula $R^4_3SiOR^8$; and, (iv) optionally, Q units having a formula $Si(OR^9)_4$; wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; and wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≦100 ppm in combined total of all target contaminants having formulae selected from $R^1$—O—$(R^2)$Si$(OR^6)_2$; $R^2$—O—$(R^1)$Si$(OR^6)_2$; $R^1(R^{10})$Si$(OR^6)_2$; and, $R^2(R^{11})$Si$(OR^6)_2$; wherein $R^{10}$ is selected from a phenol-oxy-phenyl group and a phenyl-oxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/TiO$_2$ composite; wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure; providing a semiconductor light emitting diode die having a face, wherein the semiconductor light emitting diode die emits light through the face; providing a mold with a cavity; disposing the semiconductor light emitting diode die in the cavity; injecting the curable liquid polysiloxane/TiO$_2$ composite into the cavity; contacting the semiconductor light emitting diode die with the curable liquid polysiloxane/TiO$_2$ composite in the cavity, wherein the semiconductor light emitting diode die is immersed in the curable liquid polysiloxane/TiO$_2$ composite; and, curing the curable liquid polysiloxane/TiO$_2$ composite to form an optical element; wherein the optical element encapsulates the semiconductor light emitting diode die.

The present invention provides a method of making a light emitting diode (LED) having an optical element, comprising: providing a curable liquid polysiloxane/TiO$_2$ composite, comprising: (a) providing: (i) D units having a formula $R^1(R^2)$Si$(OR^6)_2$; (ii) T units having a formula $R^3$Si$(OR^7)_3$; (iii) optionally, M units having a formula $R^4_3$SiOR$^8$; and, (iv) optionally, Q units having a formula Si$(OR^9)_4$; wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; and wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≦100 ppm in combined total of all target contaminants having formulae selected from $R^1$—O—$(R^2)$Si$(OR^6)_2$; $R^2$—O—$(R^1)$Si$(OR^6)_2$; $R^1(R^{10})$Si$(OR^6)_2$; and, $R^2(R^{11})$Si$(OR^6)_2$; wherein $R^{10}$ is selected from a phenol-oxy-phenyl group and a phenyl-oxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/TiO$_2$ composite; wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure; providing a semiconductor light emitting diode die having a face, wherein the semiconductor light emitting diode die emits light through the face; providing a mold with a cavity; disposing the semiconductor light emitting diode die in the cavity; injecting the curable liquid polysiloxane/TiO$_2$ composite into the cavity; contacting the semiconductor light emitting diode die with the curable liquid polysiloxane/TiO$_2$ composite in the cavity, wherein the semiconductor light emitting diode die is immersed in the curable liquid polysiloxane/TiO$_2$ composite; curing the curable liquid polysiloxane/TiO$_2$ composite to form an optical element; wherein the optical element encapsulates the semiconductor light emitting diode die; providing a component lens; and, joining the component lens to the optical element.

The present invention provides a method of making a light emitting diode (LED) having an optical element, comprising: providing a curable liquid polysiloxane/TiO$_2$ composite, comprising: (a) providing: (i) D units having a formula $R^1(R^2)$Si$(OR^6)_2$; (ii) T units having a formula $R^3$Si$(OR^7)_3$; (iii) optionally, M units having a formula $R^4_3$SiOR$^8$; and, (iv) optionally, Q units having a formula Si$(OR^9)_4$; wherein each $R^1$ and $R^3$ is independently selected from a $C_{6-10}$ aryl group and a $C_{7-20}$ alkylaryl group; wherein each $R^2$ is a phenoxyphenyl group; wherein each $R^4$ is independently selected from a $C_{1-10}$ alkyl group, a $C_{7-10}$ arylalkyl group, a $C_{7-10}$ alkylaryl group and a $C_{6-10}$ aryl group; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; and wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≦100 ppm in combined total of all target contaminants having formulae selected from $R^1$—O—$(R^2)$Si$(OR^6)_2$; $R^2$—O—$(R^1)$Si$(OR^6)_2$; $R^1(R^{10})$Si$(OR^6)_2$; and, $R^2(R^{11})$Si$(OR^6)_2$; wherein $R^{10}$ is selected from a phenol-oxy-phenyl group and a phenyl-oxy-(hydroxy)phenyl group and wherein $R^{11}$ is a hydroxyphenyl group; (b) combining in an aprotic solvent the D units, the T units, any optional M units and any optional Q units; (c) adding to the combination of (b) an acid in a miscible mixture of water and an alcohol to form a reaction mixture; (d) allowing the reaction mixture to react; (e) adding an organo-titanate in an aprotic solvent to the reacted reaction mixture of (d); (f) adding water to the product of (e); (g) heating the product of (f) and allowing it to react; and, (h) purifying the product of (g) to provide the curable liquid polysiloxane/TiO$_2$ composite; wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure; providing a support structure having a plurality of individual semiconductor light emitting diode dies, wherein each semiconductor light emitting diode die has a face through which it emits light; providing a mold having at least one cavity; filling the at least one cavity with the curable liquid polysiloxane/TiO$_2$ composite; wherein the support structure and the mold are oriented such that the plurality of individual semiconductor light emitting diode dies are each at least partially immersed in the curable liquid polysiloxane/TiO$_2$ composite contained in the at least one cavity; and, curing the curable liquid polysiloxane/TiO$_2$ composite to form an optical element; wherein the optical element encapsulates the plurality of individual semiconductor light emitting diode dies; and, wherein at least a portion of the at least one optical element is adjacent to the face of each individual semiconductor light emitting diode die.

DETAILED DESCRIPTION

The method of making a light emitting diodes (LED) having an optical element of the present invention facilitates the manufacture of designed manifolds containing multiple individual semiconductor light emitting diode dies for use in, for example, automobile headlight assemblies and displays. The method of making light emitting diodes (LED) having an optical element of the present invention also facilitates the mass production of individual semiconductor light emitting diodes. That is, upon curing of the curable liquid polysiloxane/$TiO_2$ composite, the mold can be separated from the assembly and the plurality of individual semiconductor light emitting diode dies encapsulated by the cured curable polysiloxane/$TiO_2$ composite on the substrate can be diced into multiple individual semiconductor light emitting diode dies or a plurality of manifolds containing multiple individual semiconductor light emitting diode dies.

The method of making a light emitting diode (LED) having an optical element of the present invention is designed to facilitate the manufacture of semiconductor light emitting diodes (LED) using closed molds, wherein the semiconductor light emitting diode dies are at least partially encapsulated in a cured, curable liquid polysiloxane/$TiO_2$ composite that surprisingly exhibits a high refractive index (>1.61) enabled in part through a high $TiO_2$ loading (>20 mol %, based on total solids) while remaining in liquid form at room temperature and pressure with minimal (<4 wt %, preferably <2.5 wt %) or no added fugitive solvent (i.e., neat). This is important because the incorporation of fugitive solvent materials tend to result in off-gassing and undesirable bubble formation during curing. Such bubble formation typically results in an undesirable loss in performance properties for the semiconductor light emitting diode (LED) formed.

The curable liquid polysiloxane/$TiO_2$ composite used in the method of making a light emitting diode (LED) of the present invention is prepared using D units that are treated to contain ≤100 ppm in combined total of all target contaminants having formulae selected from $R^1$—O—$(R^2)Si(OR^6)_2$; $R^2$—O—$(R^1)Si(OR^6)_2$; $R^1(R^{10})Si(OR^6)_2$; and, $R^2(R^{10})Si(OR^6)_2$; wherein $R^{10}$ is selected from a phenol-oxy-phenyl group and a phenyl-oxy-(hydroxy)phenyl group and wherein $R^{11}$ is a hydroxyphenyl group; to reduce or eliminate undesired color formation. While not an issue for polysiloxane encapsulants, it has been surprisingly found that the target impurities can interact with $TiO_2$ in the preparation of polysiloxane/$TiO_2$ composites to create undesired color formations. The target contaminants are difficult to separate from the D units. Accordingly, it is possible to obtain high purity D units that still contain an undesirably high concentration of at least one of the target contaminants.

The curable liquid polysiloxane/$TiO_2$ composite used in the method of making a light emitting diode (LED) of the present invention is curable using well known methods. Preferably, the curable liquid polysiloxane/$TiO_2$ composite used is thermally curable (preferably upon heating at 100 to 200° C. for 10 to 120 minutes).

The curable liquid polysiloxane/$TiO_2$ composite used in the method of making a light emitting diode (LED) of the present invention, comprises (preferably consists essentially of): a polysiloxane with $TiO_2$ domains having an average domain size of less than 5 nm (preferably ≤3 nm) as determined by transmission electron microscopy (TEM); wherein the polysiloxane has an average compositional formula:

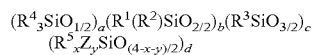

wherein each $R^1$ and $R^3$ is independently selected from a $C_{6-10}$ aryl group and a $C_{7-20}$ alkylaryl group (preferably both $R^1$ and $R^3$ are phenyl groups); wherein each $R^2$ is a phenoxyphenyl group, wherein the phenoxyphenyl group is bound with the silicon to form at least one of three different isomers, namely an ortho-phenoxyphenyl silane group, a meta-phenoxyphenyl silane group, or a para-phenoxyphenyl silane group; wherein each $R^4$ is independently selected from a $C_{1-10}$ alkyl group, a $C_{7-10}$ arylalkyl group, a $C_{7-10}$ alkylaryl group and a $C_{6-10}$ aryl group (preferably a $C_{1-5}$ alkyl group, a $C_{7-10}$ arylalkyl group, a $C_{7-10}$ alkylaryl group and a phenyl group; more preferably a $C_{1-5}$ alkyl group and a phenyl group; most preferably a methyl group and a phenyl group); wherein each $R^5$ is independently selected from a $C_{1-10}$ alkyl group, a $C_{7-10}$ arylalkyl group, a $C_{7-10}$ alkylaryl group, a $C_{6-10}$ aryl group and a phenoxyphenyl group (preferably a $C_{1-5}$ alkyl group, a $C_{7-10}$ arylalkyl group, a $C_{7-10}$ alkylaryl group, a phenyl group and a phenoxyphenyl group; more preferably a $C_{1-5}$ alkyl group, a phenyl group and a phenoxyphenyl group; most preferably a methyl group, a phenyl group and a phenoxyphenyl group); wherein each Z is independently selected from a hydroxyl group and a $C_{1-10}$ alkoxy group (preferably a hydroxyl group and a $C_{1-4}$ alkoxy group, more preferably a hydroxyl group and a $C_{1-2}$ alkoxy group); wherein 0≤a≤0.005; wherein 0.8495≤b≤0.9995 (preferably 0.9≤b≤0.9995, more preferably 0.9≤b≤0.9992, most preferably 0.95≤b≤0.9992); wherein 0.0005≤c≤0.10 (preferably 0.0008≤c≤0.10, more preferably 0.001≤c≤0.06, most preferably 0.001≤c≤0.02); wherein 0≤d≤0.15 (preferably 0≤d≤0.099, more preferably 0<d≤0.04, most preferably 0.0005≤d≤0.02); wherein the curable liquid polysiloxane/$TiO_2$ composite contains 20 to 60 mol % $TiO_2$ (based on total solids) (preferably 20 to 58 mol %, more preferably 30 to 58 mol %, most preferably 50 to 58 mol %); wherein each x is independently selected from 0, 1 and 2 (i.e., x can be the same or different for each $R^5_xZ_ySiO_{(4-x-y)/2}$ group); wherein each y is independently selected from 1, 2 and 3 (i.e., y can be the same or different for each $R^5_xZ_ySiO_{(4-x-y)/2}$ group); wherein a+b+c+d=1; wherein the polysiloxane comprises, as initial components: (i) D units having a formula $R^1(R^2)Si(OR^6)_2$; (ii) T units having a formula $R^3Si(OR^7)_3$; (iii) optionally, M units having a formula $R^4_3SiOR^8$; and, (iv) optionally, Q units having a formula $Si(OR^9)_4$; wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group; wherein the D units contain >1 ppb to ≤100 ppm (preferably ≤50 ppm; more preferably ≤30 ppm; most preferably ≤10 ppm; preferably >1 ppb) in combined total of all the target contaminants having formulae selected from $R^1$—O—$(R^2)Si(OR^6)_2$; $R^2$—O—$(R^1)Si(OR^6)_2$; $R^1(R^{10})Si(OR^6)_2$; and, $R^2(R^{11})Si(OR^6)_2$; wherein $R^{10}$ is selected from a phenol-oxy-phenyl group and a phenyl-oxy-(hydroxy)phenyl group; wherein the phenol-oxy-phenyl group (if present) is bound with the silicon to form at least one of three different isomers, namely an ortho phenol-oxy-phenyl silane group, a meta phenol-oxy-phenyl silane group, or a para phenol-oxy-phenyl silane group; wherein the phenyl-oxy-(hydroxy)phenyl group (if present) is bound with the silicon to form at least one of three difference isomers, namely an ortho phenyl-oxy-(hydroxy)phenyl silane group, a meta phenyl-oxy-(hydroxy)phenyl silane group, or a para phenyl-oxy-(hydroxy)phenyl silane group; and, wherein $R^{11}$ is a hydroxyphenyl group; and, wherein the curable liquid polysiloxane/$TiO_2$ composite is a liquid at room temperature and atmospheric pressure. Preferably, the curable liquid polysiloxane/$TiO_2$ composite used in the method of the present invention exhibits a refractive index of >1.61 to 1.7, more preferably 1.63 to 1.66, most preferably 1.64 to 1.66. Preferably, the curable liquid polysiloxane/TiO$_2$ composite used in the method of the present invention exhibits a viscosity of <600,000 Pa*s, more preferably 4 to 100,000 Pa*s, most preferably 4 to 20,000 Pa*s measured under the conditions set forth in the Examples. Preferably, the curable liquid polysiloxane/TiO$_2$ composite used in the method of the present invention is thermally curable, optionally with the addition of a catalyst.

The formation of the curable liquid polysiloxane/TiO$_2$ composite in (f) also results in the formation of by-products such as ethanol, methanol, isopropanol and water. These by-products are advantageously removed from the curable liquid polysiloxane/TiO$_2$ composite in (g). Preferably, these by-products are removed from the curable liquid polysiloxane/TiO$_2$ composite in (g) by at least one of distillation and roto-evaporation. Optionally, an extraction solvent can be used to aid in the removal of these by-products. Examples of extraction solvents include C$_{5-12}$ linear, branched and cyclic alkanes (e.g., hexane, heptane and cyclohexane); ethers (e.g., tetrahydrofuran, dioxane, ethylene glycol diether ether and ethylene glycol dimethyl ether); ketones (e.g., methyl isobutyl ketone, methyl ethyl ketone and cyclohexanone); esters (e.g., butyl acetate, ethyl lactate and propylene glycol methyl ether acetate); halogenated solvents (e.g., trichloroethane, bromobenzene and chlorobenzene); silicone solvents (e.g., octamethylcyclotetrasiloxane and decamethylcyclopentasiloxane); and combinations thereof.

Preferably, the D units used in the preparation of the curable liquid polysiloxane/TiO$_2$ composite used in the method of making a light emitting diode (LED) of the present invention are specifically treated to minimize the content of the target contaminants. Preferably, the D units contain >1 ppb to ≦100 ppm (preferably ≦50 ppm; more preferably ≦30 ppm; most preferably ≦10 ppm; preferably >1 ppb) in combined total of all the target contaminants. Preferably, the D units are treated by recrystallization to remove the type A and type B contaminants. More preferably, the D units are treated by multiple recrystallizations to remove the type A and type B contaminants. Most preferably, the D units are purified by at least three successive recrystallizations to remove the type A and type B contaminants. Preferably, the D units can be treated with a nucleophile (e.g., sodium methoxide, potassium methoxide) to convert the target contaminants having formulae R$^1$—O—(R$^2$)Si(OR$^6$)$_2$ and R$^2$—O—(R$^1$)Si(OR$^6$)$_2$ into materials that are more easily separated from the D units using conventional distillation techniques.

Preferably, the D units used in the preparation of the curable liquid polysiloxane/TiO$_2$ composite used in the method of making a light emitting diode (LED) of the present invention have a formula

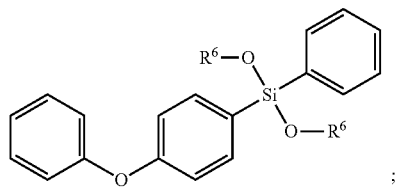

wherein the D units contain >1 ppb to ≦100 ppm (preferably ≦50 ppm; more preferably ≦ppm; most preferably ≦10; preferably >1 ppb) in combined total of all of the target contaminants; wherein the target contaminants have formulae selected from

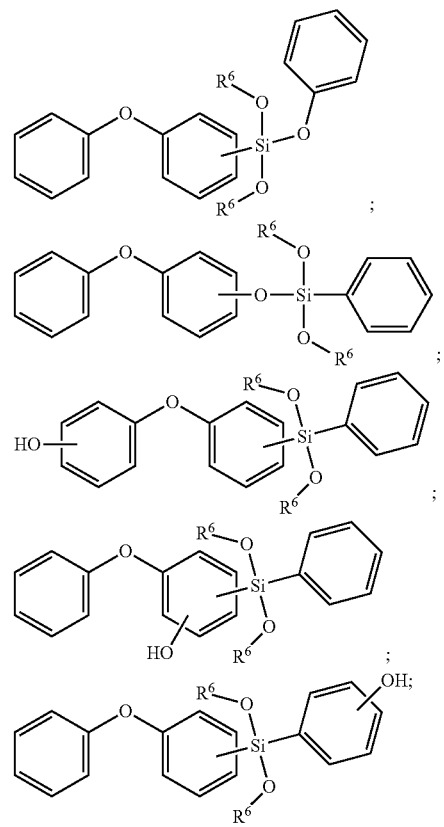

and, wherein each R$^6$ is independently selected from hydrogen and a C$_{1-4}$ alkyl group.

Preferably, the T units used in the preparation of the curable liquid polysiloxane/TiO$_2$ composite used in the method of making a light emitting diode (LED) of the present invention have a formula

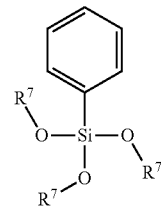

wherein each R$^7$ is independently selected from hydrogen and a C$_{1-4}$ alkyl group (more preferably, wherein each R$^7$ is a methyl group.

Preferably, the acid used in the preparation of the curable liquid polysiloxane/TiO$_2$ composite used in the method of making a light emitting diode (LED) of the present invention is selected from Brönsted acids (e.g., acetic acid, formic acid, propionic acid, citric acid, hydrochloric acid, sulfuric acid and phosphoric acid). More preferably, acid used is hydrochloric acid.

Preferably, the organo-titanate used in the preparation of the curable liquid polysiloxane/TiO$_2$ composite used in the method of making a light emitting diode (LED) of the present invention is selected from organo-titanates according to the formula (R$^{12}$O)$_e$Ti$_f$O$_{(f-1)}$; wherein each R$^{12}$ is independently selected from a C$_{1-20}$ alkyl group, a C$_{6-10}$ aryl group, a C$_{7-20}$ alkylaryl group and a $C_{7-20}$ arylalkyl group; wherein f is selected from 1, 2, 3, 4 and 5; and wherein $e=2*(f+1)$. More preferably, the organo-titanate used is selected from tetraethyl titanate; tetraisopropyl titanate; tetra-n-propyl titanate; tetra-n-butyl titanate; tetraisooctyl titanate; tetraisostearoyl titanate; tetraoctyleneglycol titanate; ethoxybis(pentane-2,4-dionato-0,0')propan-2-olato)titanium and titanium tetrabutanolate polymer. Most preferably the organo-titante used is a titanium tetrabutanolate polymer (e.g., Tyzor® BTP available from DuPont).

Preferably, the curable liquid polysiloxane/$TiO_2$ composite used in the method of making a light emitting diode (LED) of the present invention has a purity of $\geq 95$ wt % (more preferably $\geq 98$ wt %). Preferably, the raw materials used in the preparation of the curable liquid polysiloxane/$TiO_2$ composite used in the method of the present invention are purified to enhance the purity of the curable liquid polysiloxane/$TiO_2$ composite. The raw materials used can be purified by, for example, crystallization, distillation, chromatography, solvent extraction, membrane separation and other well known purification processes.

The curable liquid polysiloxane/$TiO_2$ composite used in the method of making a light emitting diode (LED) of the present invention optionally further comprise an additive selected from the group consisting of inert diluents; reactive diluents; hindered amine light stabilizers (HALS); lubricity additives; fungicides; flame retardants; contrast enhancers; UV-stabilizers; photostabilizers; surfactants; adhesive modifiers; rheology modifiers; phosphors; absorbing dyes; fluorescent dyes; electrical or thermal conductivity additives; chelating or sequestrating agents; acid scavengers; base scavengers; metal passivators; and metal fortifiers.

The method of making a light emitting diode (LED) having an optical element of the present invention comprises: providing a curable liquid polysiloxane/$TiO_2$ composite, comprising: (a) combining in an aprotic solvent: (i) D units having a formula $R^1(R^2)Si(OR^6)_2$ (preferably 84.95 to 99.95 mol %, more preferably 90 to 99.95 mol %, still more preferably 90 to 99.92 mol %, most preferably 95 to 99.92 mol % D units); (ii) T units having a formula $R^3Si(OR^7)_3$ (preferably 0.05 to 10 mol %, more preferably 0.08 to 10 mol %, still more preferably 0.1 to 6 mol %, most preferably 0.1 to 2 mol % T units); (iii) optionally, M units having a formula $R^4{}_3SiOR^8$ (preferably 0 to 0.5 mol % M units); and, (iv) optionally, Q units having a formula $Si(OR^9)_4$ (preferably 0 to 15 mol %, more preferably 0 to 9.9 mol %, still more preferably 0 to 4 mol %, most preferably 0.05 to 2 mol % Q units); wherein each $R^1$ and $R^3$ is independently selected from a $C_{6-10}$ aryl group and a $C_{7-20}$ alkylaryl group (preferably both $R^1$ and $R^3$ are phenyl groups); wherein each $R^2$ is a phenoxyphenyl group, wherein the phenoxyphenyl group is bound with the silicon to form at least one of three different isomers, namely an ortho-phenoxyphenyl silane group, a meta-phenoxyphenyl silane group, or a para-phenoxyphenyl silane group; wherein each $R^4$ is independently selected from a $C_{1-10}$ alkyl group, a $C_{7-10}$ arylalkyl group, a $C_{7-10}$ alkylaryl group and a $C_{6-10}$ aryl group (preferably a $C_{1-5}$ alkyl group, a $C_{7-10}$ arylalkyl group, a $C_{7-10}$ alkylaryl group and a phenyl group; more preferably a $C_{1-5}$ alkyl group and a phenyl group; most preferably a methyl group and a phenyl group); wherein each $R^6$, $R^7$, $R^8$ and $R^9$ is independently selected from a hydrogen atom, a $C_{1-10}$ alkyl group, a $C_{7-10}$ arylalkyl group, a $C_{7-10}$ alkylaryl group and a $C_{6-10}$ aryl group (preferably a hydrogen and a $C_{1-5}$ alkyl group; more preferably a hydrogen and a methyl group; most preferably a methyl group); (b) adding to the combination of (a) an acid (preferably a mineral acid; more preferably a mineral acid selected from hydrochloric acid, nitric acid, phosphoric acid, sulfuric acid, boric acid, hydrofluoric acid and hydrobromic acid; still more preferably a mineral acid selected from hydrochloric acid, nitric acid and sulfuric acid; most preferably hydrochloric acid) in a miscible mixture of water and an alcohol (preferably an alcohol selected from a $C_{1-8}$ alkyl hydroxide, more preferably an alcohol selected from methanol, ethanol, propanol and butanol) to form a reaction mixture (preferably, by a drop-wise addition, more preferably by a dropwise addition while maintaining the temperature at 0 to 80° C., most preferably by a dropwise addition while maintaining the temperature at 15 to 70° C.); (c) allowing the reaction mixture to react (preferably, while maintaining the reaction mixture at a temperature of 0 to 80° C.; more preferably, while maintaining the reaction mixture at a temperature of 15 to 70° C.); (d) adding an organo-titanate in an aprotic solvent to the reacted reaction mixture of (c) (preferably by a dropwise addition, more preferably by a dropwise addition while maintaining the temperature at 30 to 100° C., most preferably by a dropwise addition while maintaining the temperature at 70° C.); (e) adding water to the product of (d) (preferably by a dropwise addition, more preferably by a dropwise addition while maintaining the temperature at 30 to 100° C., most preferably by a dropwise addition while maintaining the temperature at 70° C.); (f) heating the product of (e) and allowing it to react to form the curable liquid polysiloxane/$TiO_2$ composite (preferably, the product of (e) is heated to a temperature of >60°, more preferably 60 to 150° C.); and, (g) purifying the product of (f) to provide the curable liquid polysiloxane/$TiO_2$ composite, wherein the curable liquid polysiloxane/$TiO_2$ composite contains 20 to 60 mol % $TiO_2$ (based on total solids), wherein the curable liquid polysiloxane/$TiO_2$ composite exhibits a refractive index of >1.61 to 1.7 (preferably 1.63 to 1.66, more preferably 1.64 to 1.66), wherein the curable liquid polysiloxane/$TiO_2$ composite is a liquid a room temperature and pressure (preferably exhibits a viscosity of <600,000 Pa*s, more preferably 4 to 100,000 Pa*s, most preferably 4 to 20,000 Pa*s as measured under the conditions set forth in the Examples), and wherein the curable liquid polysiloxane/$TiO_2$ composite is preferably thermally curable (optionally with the addition of a catalyst); providing a semiconductor light emitting diode die having a face, wherein the semiconductor light emitting diode die emits light through the face; contacting the semiconductor light emitting diode die with the curable liquid polysiloxane/$TiO_2$ composite; and, curing the curable liquid polysiloxane/$TiO_2$ composite to form an optical element; wherein at least a portion of the optical element is adjacent to the face.

Preferably, the method of making a light emitting diode (LED) having an optical element of the present invention, further comprises: providing a mold with a cavity; filling the cavity with the curable liquid polysiloxane/$TiO_2$ composite; contacting the semiconductor light emitting diode die with the curable liquid polysiloxane/$TiO_2$ composite in the cavity; wherein the optical element encapsulates the semiconductor light emitting diode die (preferably, wherein the semiconductor light emitting diode die is immersed in the curable liquid polysiloxane/$TiO_2$ composite before curing to form the optical element). Preferably, the optical element formed from the curable liquid polysiloxane/$TiO_2$ composite is an integral lens.

Preferably, the method of making a light emitting diode (LED) having an optical element of the present invention, further comprises: providing a component lens (i.e., a lens formed from a material other than from the curable liquid polysiloxane/$TiO_2$ composite); and, joining the component lens to the optical element. The component lens can be cured to the optical element simultaneously with the curing of the curable liquid polysiloxane/TiO$_2$ composite. For example, the component lens can form a portion of the mold. The component lens can also be joined (for example using a mechanical connector or an optically transparent glue) to the optical element subsequent to the curing of the curable liquid polysiloxane/TiO$_2$ composite.

Preferably, the method of making a light emitting diode (LED) having an optical element of the present invention, further comprises: providing a mold with a cavity; disposing the semiconductor light emitting diode die in the cavity; injecting the curable liquid polysiloxane/TiO$_2$ composite into the cavity; curing the curable liquid polysiloxane/TiO$_2$ composite to form the optical element (preferably, curing the curable liquid polysiloxane/TiO$_2$ composite by heating to 100 to 200° C. for 10 to 120 minutes); wherein the optical element encapsulates the semiconductor light emitting diode die. Preferably, the curable liquid polysiloxane/TiO$_2$ composite when cured both encapsulates the individual semiconductor light emitting diode dies and functions as a lens designed to direct the light extracted from the dies.

Preferably, the method of making a light emitting diode (LED) having an optical element of the present invention, further comprises: providing a component lens; and, joining the component lens to the optical element (for example using a mechanical connector or an optically transparent glue). Preferably, the component lens can be designed to improve the light extracting or directing properties of the semiconductor light emitting diode (LED) produced. Preferably, the component lens can be designed to alter the wavelength(s) of light extracted from the light emitting diode (LED) produced using techniques well known in the art (e.g., use of a phosphor).

Preferably, the method of making a light emitting diode (LED) having an optical element of the present invention, further comprises: providing a mold having at least one cavity (preferably, providing a mold having a plurality of cavities, wherein the plurality of cavities correspond with the plurality of individual semiconductor light emitting diode dies); filling the at least one cavity (preferably, filling the plurality of cavities) with the curable liquid polysiloxane/TiO$_2$ composite; wherein providing the semiconductor light emitting diode die, comprises: providing a support structure having a plurality of individual semiconductor light emitting diode dies, wherein each semiconductor light emitting diode die has a face through which it emits light; wherein the support structure and the mold are oriented such that the plurality of individual semiconductor light emitting diode dies are each at least partially immersed in the curable liquid polysiloxane/TiO$_2$ composite contained in the at least one cavity; wherein the curing of the curable liquid polysiloxane/TiO$_2$ composite forms at least one optical element; and, wherein at least a portion of the at least one optical element is adjacent to the face of each individual semiconductor light emitting diode die. Preferably, the cured, curable liquid polysiloxane/TiO$_2$ composite forms a plurality of optical elements, corresponding to the plurality of individual semiconductor light emitting diode dies and wherein one of the plurality of optical elements is adjacent to the face of each semiconductor light emitting diode die. The face of two or more semiconductor light emitting diode dies can be adjacent to each one of the plurality of optical elements formed. The lens formed using the cured, curable liquid polysiloxane/TiO$_2$ composite can be a simple lens or a complex lens (e.g., a Fresnel lens and an aspherical lens). Preferably, the cured, curable liquid polysiloxane/TiO$_2$ composite forms a lens array (preferably, wherein each lens in the array corresponds with each one of the plurality of individual semiconductor light emitting diode dies).

Preferably, the mold further comprises a plurality of feed channels that facilitate injection of the curable liquid polysiloxane/TiO$_2$ composite into the at least one cavity. Preferably, the mold further comprises a plurality of feed channels that facilitate injection of the curable liquid polysiloxane/TiO$_2$ composite into a plurality of cavities in the mold.

Some embodiments of the present invention will now be described in detail in the following Examples.

Siloxane monomer having the structural formula

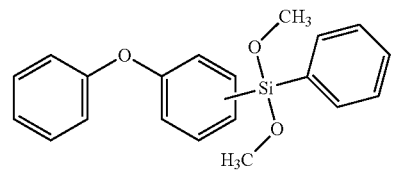

is referred to in the following examples as "POP". The POP monomer used in the following examples was prepared according to the basic procedure described in Example 1.

Siloxane monomer having the structural formula

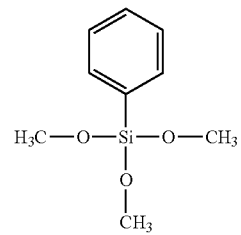

is referred to in the following examples as PTMS and is commercially available from Gelest Inc.

Example 1

Distilled POP Monomer Preparation

A 500 mL Schlenk flask was charged with diethyl ether (400 mL); magnesium metal powder (3.3 g; 135 mmol); and methyl iodide (0.1 mL). The flask was then further charged with 4-bromodiphenyl ether (32.161 g; 129 mmol) and the reaction mixture was stirred for 4 hours. Phenyltrimethoxysilane (25.601 g, 129 mmol) was then added to the flask and the contents were then stirred for an additional hour. The contents of the flask were then transferred to a 1 L separatory funnel and the material was washed twice with 400 mL of distilled water. The ether layer was collected and the volatiles were removed under reduced pressure. The crude product was treated by a short path distillation to provide a distilled POP material.

Example 2

Purification of Distilled POP Monomer

Distilled POP material prepared according to Example 1 was purified by three (3) successive recrystallizations. Distilled POP (6 g) prepared according to Example 1 was placed in a 30 mL vial to which 15 mL of pentane (HPLC grade from Fisher Scientific) was then added at room temperature. The vial was capped, warmed to 50° C. and then shaken to dissolve the distilled POP material. The capped vial was then placed in a freezer at −20° C. The capped vial was kept in the freezer until the contents of the vial crystallized out of solution. The liquid was then decanted from the crystals and the process was repeated two more times. The crystals were then dried under vacuum at room temperature for an hour to provide a product POP material.

The product POP material was then analyzed by using gas chromatography time of flight mass spectrometry (Agilent 7890 GC/LECO MS) and by using gas cromatography-flame ionization detection (Agilent 7890). The GC-MS separation was performed using a DB-5 column (DB-5, 30 m×0.32 mm×0.25 μm from Agilent) and a Rtx-200 column (Rtx-200, 30 mm×0.25 mm×1.0 μm from Restek). For the DB-5 column, the temperature profile used was 200° C. for two minutes, followed by a temperature ramp from 200° C. to 300° C. at 5° C./min, and then 300° C. for 2 minutes with a column flow rate of 1.5 mL/min. For the Rtx-200 column, the temperature profile used was 200° C. for two minutes, followed by a temperature ramp from 200° C. to 285° C. at 2° C./min and then 285° C. for two minutes with a column flow rate of 1.0 mL/min. The injection volume was 1.0 μL and the split ratio was 50:1. The sample was prepared by dissolving 0.10 g of the product POP material in 10 mL of heptane. Area percent analysis of the GC-FID chromatograms was performed to determine the amount of each impurity. The results of the analysis showed that the product POP material contained 20 ppm in combined total of all the target contaminants having formulae selected from the following:

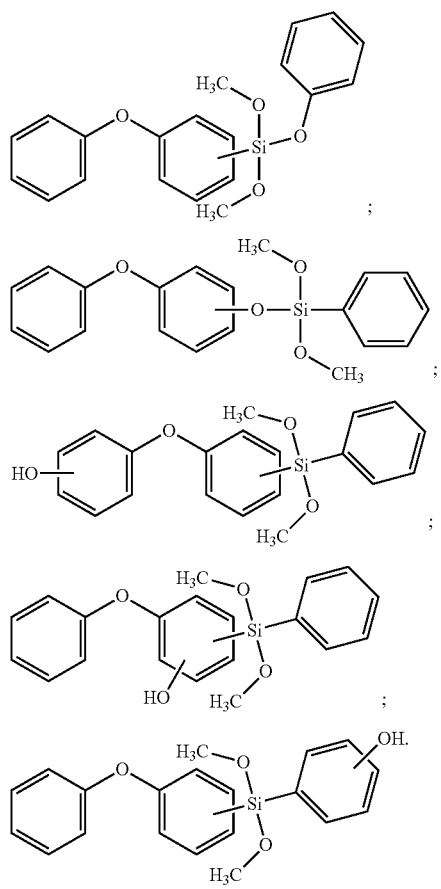

Example 3

Purification of Distilled POP Monomer

Distilled POP material prepared according to Example 1 was purified through treatment with a nucleophile. Distilled POP (33.15 g) and 100 mL of dimethoxyethane were added to a 250 mL round bottom flask. The nucleophile solution (2.4 mL of 0.1 N KOCH$_3$ in toluene) was then added to the flask. The flask contents were allowed to react at room temperature for three hours. Hydrochloric acid (24.6 mg of 37 wt % hydrochloric acid solution from Fisher Scientific) was then added to the flask. The flask contents were allowed to react at room temperature for one hour. The solvent was then removed from the flask under vacuum at 60° C. The remaining flask contents were then subjected to short path distillation at 100 mTorr and 200° C. to give a product POP material. The product POP material was then analyzed by GC-MS and GC-FID as described in Example 2 according to the process described. The results of the analysis showed that the product POP material contained 50 ppm in combined total of all the target contaminants having formulae noted in Example 2.

Comparative Example A and Examples 4-6

Preparation of Curable Liquid Polysiloxane/TiO$_2$ Composites

Curable liquid polysiloxane/TiO$_2$ composites were prepared using the following general procedure using the specific amounts noted in T$_{ABLE}$ 1. Specifically, the distilled POP prepared according to Example 1 and PTMS in the amounts noted in T$_{ABLE}$ 1 were added with 13.2 g of propylene glycol methyl ether acetate (PGMEA) a 100 mL three-neck round bottom flask. A solution of 5.0 g methanol, 1.0 g water and 0.16 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in T$_{ABLE}$ 1 dissolved in 8.8 g of PGMEA and 1 mL of dry tetrahydrofuran (THF) was then added to the flask drop wise through an addition funnel while maintaining the temperature of the flask contents at 70° C. for 1 hour. Water (0.1 mL) and PGMEA (4.4 g) were then added to the flask. The contents of the flask were then heated to 100° C. and allowed to react for 1 hour. The volatiles were then distilled out of the flask with a short path distillation column. Volatiles were then further eliminated from the flask contents by roto-evaporation followed by the pulling of a high vacuum (25 mTorr) at 60° C. The product optically clear, curable liquid polysiloxane/TiO$_2$ composite of Examples 4-6 was then recovered from the flask. Note that the reaction described in Comparative Example A yielded a milky white two phase mixture, indicating the formation and aggregation of colloidal TiO$_2$ particles.

TABLE 1

| Ex. # | POP (in g) | PTMS (in g) | Tyzor ® BPT (in g) | POP (in mol %) ς | PTMS (in mol %) ς | TiO$_2$ (in mol %) λ |
|---|---|---|---|---|---|---|
| A | 3.4 | 0.106 | 5.45 | 95 | 5 | 67 |
| 4 | 5.9 | 0.212 | 4.54 | 94 | 6 | 49.1 |

TABLE 1-continued

| Ex. # | POP (in g) | PTMS (in g) | Tyzor® BPT (in g) | POP (in mol %)ς | PTMS (in mol %)ς | TiO$_2$ (in mol %)д |
|---|---|---|---|---|---|---|
| 5 | 5.9 | 0.212 | 5.45 | 94 | 6 | 53.7 |
| 6 | 3.4 | 0.106 | 0.83 | 95 | 5 | 23.6 |

ς based on total moles of siloxane monomers (POP + PTMS)

д based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

Comparative Example B and Examples 7-10

Preparation of Curable Liquid Polysiloxane/TiO$_2$ Composites

Curable liquid polysiloxane/TiO$_2$ composites were prepared using the following general procedure using the specific amounts noted in TABLE 2. Specifically, the distilled POP prepared according to Example 1 and PTMS in the amounts noted in TABLE 2 were added with 6.6 g of propylene glycol methyl ether acetate (PGMEA) a 100 mL three-neck round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 2 dissolved in 4.4 g of PGMEA and 0.5 mL of dry tetrahydrofuran (THF) was then added to the flask drop wise through an addition funnel while maintaining the temperature of the flask contents at 70° C. for 1 hour. Water (0.05 mL) and PGMEA (2.2 g) were then added to the flask. The contents of the flask were then heated to 100° C. and allowed to react for 1 hour. The volatiles were then distilled out of the flask with a short path distillation column. Volatiles were then further eliminated from the flask contents by roto-evaporation followed by the pulling of a high vacuum (25 mTorr) at 60° C. The product optically clear, curable liquid polysiloxane/TiO$_2$ composite was then recovered from the flask.

TABLE 2

| Ex. # | POP (in g) | PTMS (in g) | Tyzor® BPT (in g) | POP (in mol %)ς | PTMS (in mol %)ς | TiO$_2$ (in mol %)д |
|---|---|---|---|---|---|---|
| B | 2.9 | 0.085 | 0 | 95 | 5 | 0 |
| 7 | 2.9 | 0.106 | 1.36 | 94 | 6 | 37 |
| 8 | 2.95 | 0.018 | 2.63 | 99 | 1 | 54 |
| 9 | 2.9 | 0.02 | 0.7 | 99 | 1 | 24 |
| 10 | 3.1 | 0.21 | 3.05 | 90 | 10 | 24 |

ς based on total moles of siloxane monomers (POP + PTMS)

д based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

Examples 11-14

Preparation of Curable Liquid Polysiloxane/TiO$_2$ Composites

Curable liquid polysiloxane/TiO$_2$ composites were prepared using the following general procedure using the specific amounts noted in TABLE 3. Specifically, the distilled POP prepared according to Example 1 and PTMS in the amounts noted in TABLE 3 were added with 15 mL of propylene glycol methyl ether acetate (PGMEA) a 100 mL three-neck round bottom flask. A solution of 5 g methanol, 1 g water and 0.16 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 3 dissolved in 10 mL of PGMEA and 1 mL of dry tetrahydrofuran (THF) was then added to the flask drop wise through an addition funnel while maintaining the temperature of the flask contents at 70° C. for 1 hour. Water (0.1 mL) and PGMEA (5 mL) were then added to the flask. The contents of the flask were then heated to 100° C. and allowed to react for 1 hour. Volatiles were then further eliminated from the flask contents by roto-evaporation under a high vacuum at 60° C. The product optically clear, curable liquid polysiloxane/TiO$_2$ composite was then recovered from the flask.

TABLE 3

| Ex. # | POP (in g) | PTMS (in g) | Tyzor® BPT (in g) | POP (in mol %)ς | PTMS (in mol %)ς | TiO$_2$ (in mol %)д |
|---|---|---|---|---|---|---|
| 11 | 5.907 | 0.0035* | 5.465 | 99.9 | 0.1 | 55.3 |
| 12 | 5.911 | 0.0175 | 5.450 | 99.5 | 0.5 | 55.0 |
| 13 | 5.902 | 0.108 | 5.472 | 97.0 | 3.0 | 54.6 |
| 14 | 5.905 | 0.224 | 5.460 | 94.0 | 6.0 | 53.7 |

* 4.7 µL of PTMS material was added to the solution, which amount contained about 0.0035 g of the monomer.

ς based on total moles of siloxane monomers (POP + PTMS)

д based on total combined moles of both siloxane monomers (POP + PTMS) and the equivalent molar amount of TiO$_2$ introduced by Tyzor ® BPT incorporation (i.e., three moles of TiO$_2$ for each mole of Tyzor ® BPT)

Comparative Examples C-D

Composites were prepared using the following general procedure using the specific amounts noted in TABLE 4. Specifically, POP monomer in the amount noted in TABLE 4 was added with 6.6 g of propylene glycol methyl ether acetate (PGMEA) a 100 mL three-neck round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. Titanium tetrabutanolate polymer (available from DuPont as Tyzor® BTP) in the amount noted in TABLE 4 dissolved in 4.4 g of PGMEA and 0.5 mL of dry tetrahydrofuran (THF) was then added to the flask drop wise through an addition funnel while maintaining the temperature of the flask contents at 70° C. for 1 hour. Water (0.05 mL) and PGMEA (2.2 g) were then added to the flask. The contents of the flask were then heated to 100° C. and allowed to react for 1 hour. The product obtained in each of Comparative Examples C and D was milky white and completely opaque, indicating the formation and aggregation of colloidal TiO$_2$ particles.

TABLE 4

| Ex. # | POP (in g) | Tyzor ® BPT (in g) | TiO$_2$ (in mol %)[a] |
|---|---|---|---|
| C | 2.9 | 0.7 | 24.4 |
| D | 2.9 | 2.6 | 54.5 |

[a] based on moles of POP and the equivalent molar amount of TiO$_2$ introduced by Tyzor ® BPT incorporation (i.e., three moles of TiO$_2$ for each mole of Tyzor ® BPT)

Comparative Example E

One Step Preparation

POP (2.9 g) and PTMS (0.09 g) dissolved in 6.6 grams of propylene glycol methyl ether acetate (PGMEA), and Tyzor® BPT (0.72 g) dissolved in 4.4 g of PGMEA and 0.5 mL of dry tetrahydrofuran (THF) were charged to a 100 mL round bottom flask. A solution of 2.5 g methanol, 0.5 g water and 0.08 g concentrated hydrochloric acid (37% in water, from Fisher Scientific) was then added to the flask drop wise. The contents of the flask were then heated to 70° C. and maintained at that temperature with a constant temperature heating mantle with a thermal probe and reflux condenser for 1.5 hours. The resulting product was milky white and completely opaque, indicating the formation and aggregation of colloidal TiO$_2$ particles.

Comparative Examples VA and VC-VE, and Examples V4-V13

The viscosity of each of the products from Comparative Examples A and C-E and Examples 4-13 was assessed in Comparative Examples VA and VC-VE, and Examples V4-V13, respectively, using the following general procedure using a Rheometrics Mechanical Spectrometer (RMS-800) made by Rheometric Scientific Inc. (currently TA Instruments, New Castle, Del.). Specifically, in each instance a sample of the material to be tested was loaded and sandwiched between two aluminum parallel plates of 8 mm diameter. The rheometer fixtures and plates were preheated to 60° C. and equilibrated at this temperature for 15 minutes before zeroing the gap between the plates. The temperature of the parallel plates was then increased to 90° C. for liquid samples having viscosities greater than 100 Pa-s to facilitate the sample loading. After loading the sample material onto the bottom plate, the instrument was placed on HOLD until the oven cooled back to 60° C. The sample gap was then adjusted to 0.5 mm. Extra sample loaded onto the bottom plate that was squeezed out to the edge of the parallel plates during the gap setting was trimmed away using a spatula. The sample gap was then recorded from the instrument micrometer once the temperature reached equilibrium (after about 15 min). A dynamic frequency sweep was then commenced from 100 rad/s to 0.1 rad/s at a strain level within the linear viscoelastic range. The complex shear viscosity was recorded as a function of frequency. The viscosity data at 60° C. and 10 rad/s is reported in TABLE 5 to indicate the relative ease with which each sample material flowed.

TABLE 5

| Ex. | Material Tested | Viscosity (in Pa · s) |
|---|---|---|
| VA | Product of A | solid |
| VC | Product of C | not measured (NM), Product of C was two phase |
| VD | Product of D | NM, Product of D was two phase |
| VE | Product of E | NM, Product of E was two phase |
| V4 | Product of Ex. 4 | $8.1 \times 10^4$ |
| V5 | Product of Ex. 5 | $5.2 \times 10^5$ |
| V6 | Product of Ex. 6 | 4.2 |
| V7 | Product of Ex. 7 | $1.4 \times 10^2$ |
| V8 | Product of Ex. 8 | $1.4 \times 10^3$ |
| V9 | Product of Ex. 9 | 7.8 |
| V10 | Product of Ex. 10 | 29 |
| V11 | Product of Ex. 11 | $6.8 \times 10^4$ |
| V12 | Product of Ex. 12 | $1.1 \times 10^4$ |
| V13 | Product of Ex. 13 | $8.2 \times 10^3$ |

Comparative Example RB and Examples R4-R14

Refractive Indexes

The refractive index of the products from Comparative Example B and Examples 4-14 were determined by visual observation in Comparative Example RB and Examples R4-R14, respectively, using an Atago Digital Refractometer (Model: RX-7000α) at sodium D-line. The results are reported in TABLE 6.

TABLE 6

| Ex. | Material Tested | RI (at 589 nm) |
|---|---|---|
| RB | Product of B | 1.608 |
| R4 | Product of Ex. 4 | 1.641 |
| R5 | Product of Ex. 5 | 1.650 |
| R6 | Product of Ex. 6 | 1.621 |
| R7 | Product of Ex. 7 | 1.637 |
| R8 | Product of Ex. 8 | 1.648 |
| R9 | Product of Ex. 9 | 1.632 |
| R10 | Product of Ex. 10 | 1.635 |
| R11 | Product of Ex. 11 | 1.651 |
| R12 | Product of Ex. 12 | 1.648 |
| R13 | Product of Ex. 13 | 1.650 |
| R14 | Product of Ex. 14 | 1.650 |

Example S4

The average TiO$_2$ domain size in the curable liquid polysiloxane/TiO$_2$ composite prepared according to Example 5 was determined to be about 3 nm by transmission electron microscopy (TEM) using a JEOL 2010F field emission transmission electron microscope operating at 200 keV and equipped with a Bruker XFlash® 5030 SDD silicon drift energy dispersive x-ray detector.

Example S11

The average TiO$_2$ domain size in the curable liquid polysiloxane/TiO$_2$ composite prepared according to Example 11 was determined to be <5 nm with a JEOL JEM 1230 transmission electron microscopy operated at a 100 kV accelerating voltage, using Gatan 791 and Gatan 794 digital cameras to capture the bright field images at −70° C. and post processing the images using Adobe Photoshop 7.0.

Examples C11-C14

In Examples C11-C14 a sample of the curable liquid polysiloxane/TiO$_2$ composite prepared according to each of Examples 11-14, respectively, was thermally cured. In each of Examples C11-C14a sample of the curable liquid polysiloxane/TiO$_2$ composite material was placed in a convection oven set at 120° C. for one hour. In each of Examples C11-C14, the initially liquid composite material was fully cured into a rigid solid following the thermal treatment in the convection oven.

We claim:

1. A method of making a light emitting diode (LED) having an optical element, comprising:
   providing a curable liquid polysiloxane/TiO$_2$ composite, comprising:
   (a) providing:
   (i) D units having a formula R$^1$(R$^2$)Si(OR$^6$)$_2$;
   (ii) T units having a formula R$^3$Si(OR$^7$)$_3$;
   (iii) optionally, M units having a formula R$^4_3$SiOR$^8$; and,
   (iv) optionally, Q units having a formula Si(OR$^9$)$_4$;
   wherein each R$^1$ and R$^3$ is independently selected from a C$_{6-10}$ aryl group and a C$_{7-20}$ alkylaryl group; wherein each R$^2$ is a phenoxyphenyl group; wherein each R$^4$ is independently selected from a C$_{1-10}$ alkyl group, a C$_{7-10}$ aralkyl group, a C$_{7-10}$ alkylaryl group and a C$_{6-10}$ aryl group; wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; and wherein each R$^6$, R$^7$, R$^8$ and R$^9$ is independently selected from a hydrogen atom, a C$_{1-10}$ alkyl group, a C$_{7-10}$ arylalkyl group, a C$_{7-10}$ alkylaryl group and a C$_{6-10}$ aryl group; wherein the D units contain >1 ppb to ≦100 ppm in combined total of all target contaminants having formulae selected from R$^1$—O—(R$^2$)Si(OR$^6$)$_2$; R$^2$—O—(R$^1$)Si(OR$^6$)$_2$; R$^1$(R$^{10}$)Si(OR$^6$)$_2$; and, R$^2$(R$^{11}$)Si(OR$^6$)$_2$; wherein R$^{10}$ is selected from a phenoloxy-phenyl group and a phenyl-oxy-(hydroxy)phenyl group and wherein R$^{11}$ is a hydroxyphenyl group;
   (b) combining in an aprotic solvent the D units, the T units, any optional M units and any optional Q units;
   (c) adding to the combination of (b) an acid in a miscible mixture of water and an alcohol to form a reaction mixture;
   (d) allowing the reaction mixture to react;
   (e) adding an organo-titanate in an aprotic solvent to the reacted reaction mixture of (d);
   (f) adding water to the product of (e);
   (g) heating the product of (f) and allowing it to react; and,
   (h) purifying the product of (g) to provide the curable liquid polysiloxane/TiO$_2$ composite;
   wherein the curable liquid polysiloxane/TiO$_2$ composite exhibits a refractive index of >1.61 to 1.7 and wherein the curable liquid polysiloxane/TiO$_2$ composite is a liquid at room temperature and atmospheric pressure;
   providing a semiconductor light emitting diode die having a face, wherein the semiconductor light emitting diode die emits light through the face;
   contacting the semiconductor light emitting diode die with the curable liquid polysiloxane/TiO$_2$ composite; and,
   curing the curable liquid polysiloxane/TiO$_2$ composite to form an optical element;
   wherein at least a portion of the optical element is adjacent to the face.

2. The method of claim 1, wherein 84.95 to 99.95 mol % D units; 0.05 to 10 mol % T units; 0 to 0.5 mol % M units; and 0 to 15 mol % Q units are combined in the aprotic solvent in (a).

3. The method of claim 2, wherein the curable liquid polysiloxane/TiO$_2$ composite provided contains 20 to 60 mol % TiO$_2$ (based on total solids).

4. The method of claim 1, further comprising:
   providing a mold with a cavity;
   filling the cavity with the curable liquid polysiloxane/TiO$_2$ composite;
   contacting the semiconductor light emitting diode die with the curable liquid polysiloxane/TiO$_2$ composite in the cavity;
   wherein the optical element encapsulates the semiconductor light emitting diode die.

5. The method of claim 1, further comprising:
   providing a component lens; and,
   joining the component lens to the optical element.

6. The method of claim 1, further comprising:
   providing a mold with a cavity;
   disposing the semiconductor light emitting diode die in the cavity;
   injecting the curable liquid polysiloxane/TiO$_2$ composite into the cavity;
   curing the curable liquid polysiloxane/TiO$_2$ composite to form the optical element;
   wherein the optical element encapsulates the semiconductor light emitting diode die.

7. The method of claim 6, further comprising:
   providing a component lens; and,
   joining the component lens to the optical element.

8. The method of claim 1, further comprising:
   providing a mold having at least one cavity;
   filling the at least one cavity with the curable liquid polysiloxane/TiO$_2$ composite;
   wherein providing the semiconductor light emitting diode die, comprises: providing a support structure having a plurality of individual semiconductor light emitting diode dies, wherein each semiconductor light emitting diode die has a face through which it emits light;
   wherein the support structure and the mold are oriented such that the plurality of individual semiconductor light emitting diode dies are each at least partially immersed in the curable liquid polysiloxane/TiO$_2$ composite contained in the at least one cavity;
   wherein curing the curable liquid polysiloxane/TiO$_2$ composite forms at least one optical element; and,
   wherein at least a portion of the at least one optical element is adjacent to the face of each individual semiconductor light emitting diode die.

9. The method of claim 8, wherein the at least one optical element is a lens.

10. The method of claim 8, wherein the mold further comprises a plurality of feed channels that facilitate injection of the curable liquid polysiloxane/TiO$_2$ composite into the at least one cavity.

* * * * *